United States Patent
Akiba

(10) Patent No.: US 12,060,517 B2
(45) Date of Patent: Aug. 13, 2024

(54) THERMAL CONDUCTIVE SILICONE COMPOSITION, SEMICONDUCTOR DEVICE, AND METHOD FOR MANUFACTURING THE SAME

(71) Applicant: SHIN-ETSU CHEMICAL CO., LTD., Tokyo (JP)

(72) Inventor: Shota Akiba, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 476 days.

(21) Appl. No.: 17/607,133

(22) PCT Filed: Apr. 6, 2020

(86) PCT No.: PCT/JP2020/015462
§ 371 (c)(1),
(2) Date: Oct. 28, 2021

(87) PCT Pub. No.: WO2020/241054
PCT Pub. Date: Dec. 3, 2020

(65) Prior Publication Data
US 2022/0213370 A1     Jul. 7, 2022

(30) Foreign Application Priority Data

May 27, 2019   (JP) ................... 2019-098441

(51) Int. Cl.
*H01L 23/00*     (2006.01)
*C08G 77/08*     (2006.01)
(Continued)

(52) U.S. Cl.
CPC ............... *C09K 5/14* (2013.01); *C08G 77/08* (2013.01); *C08G 77/12* (2013.01); *C08G 77/20* (2013.01);
(Continued)

(58) Field of Classification Search
CPC .......... C09K 5/14; C08G 77/08; C08G 77/12; C08G 77/20; C08K 3/04; C08K 3/08;
(Continued)

(56) References Cited

U.S. PATENT DOCUMENTS 5,011,870 A    4/1991 Peterson
5,981,641 A    11/1999 Takahashi et al.
(Continued)

FOREIGN PATENT DOCUMENTS

JP    H02-153995 A    6/1990
JP    H03-014873 A    1/1991
(Continued)

OTHER PUBLICATIONS

Sep. 15, 2023 Office Action issued in Taiwanese Patent Application No. 109111940.
(Continued)

*Primary Examiner* — Kyoung Lee
(74) *Attorney, Agent, or Firm* — Oliff PLC

(57) ABSTRACT

A thermal conductive silicone composition contains, in specific amounts, each of (A) an organopolysiloxane containing two or more alkenyl groups bonded to a silicon atom in one molecule, (B) an organohydrogenpolysiloxane containing two or more hydrogen atoms bonded to a silicon atom in one molecule, (C) a catalyst for hydrosilylation reaction, (D) a silver powder with a tapped density of 3.0 $g/cm^3$ or higher, a specific surface area of 2.0 $m^2/g$ or less, and an aspect ratio of 1 to 30, and (E) a natural graphite powder or a synthetic graphite powder with an average particle size of 3 μm to 50 μm. This provides: a thermal conductive silicone composition that gives a cured material having a favorable heat-dissipating property; a semiconductor device using the cured material of the composition; and a method for manufacturing the same.

3 Claims, 1 Drawing Sheet

(51) Int. Cl.
  *C08G 77/12* (2006.01)
  *C08G 77/20* (2006.01)
  *C08K 3/04* (2006.01)
  *C08K 3/08* (2006.01)
  *C09K 5/14* (2006.01)
  *H01L 23/367* (2006.01)
  *H01L 23/373* (2006.01)

(52) U.S. Cl.
  CPC .................. *C08K 3/04* (2013.01); *C08K 3/08* (2013.01); *H01L 23/367* (2013.01); *H01L 23/3737* (2013.01); *H01L 24/29* (2013.01); *C08K 2003/0806* (2013.01); *C08K 2201/001* (2013.01); *C08K 2201/005* (2013.01); *C08K 2201/006* (2013.01); *C08K 2201/014* (2013.01); *C08K 2201/016* (2013.01); *H01L 2224/29191* (2013.01)

(58) Field of Classification Search
  CPC ...... C08K 2003/0806; C08K 2201/001; C08K 2201/005; C08K 2201/006; C08K 2201/014; C08K 2201/016; C08K 2201/003; C08K 5/54; H01L 23/367; H01L 23/3737; H01L 24/29; H01L 2224/29191; H01L 23/42; H01L 23/373; C08L 83/04; C08L 2205/025
  See application file for complete search history.

(56) References Cited

U.S. PATENT DOCUMENTS

| | | |
|---|---|---|
| 2002/0018885 A1 | 2/2002 | Takahashi et al. |
| 2005/0084691 A1* | 4/2005 | Endo .................. H01L 23/3737 428/447 |
| 2017/0096591 A1 | 4/2017 | Akiba et al. |
| 2019/0002694 A1 | 1/2019 | Akiba et al. |

FOREIGN PATENT DOCUMENTS

| | | |
|---|---|---|
| JP | H10-110179 A | 4/1998 |
| JP | 2000-063872 A | 2/2000 |
| JP | 2000-063873 A | 2/2000 |
| JP | 3130193 B2 | 11/2000 |
| JP | 2002-030217 A | 1/2002 |
| JP | 2002-299534 A | 10/2002 |
| JP | 2004-111253 A | 4/2004 |
| JP | 3677671 B2 | 5/2005 |
| JP | 2008-222776 A | 9/2008 |
| JP | 2017-066406 A | 4/2017 |
| JP | 2017-069175 A | 4/2017 |
| JP | 2018-058953 A | 4/2018 |
| TW | 201800488 A | 1/2018 |
| WO | 2017/159252 A1 | 9/2017 |

OTHER PUBLICATIONS

Jul. 10, 2023 extended Search Report issued in European Patent Application No. 20813307.4.
Mar. 8, 2022 Office Action issued in Japanese Patent Application No. 2019-098441.
Nov. 16, 2021 International Preliminary Report on Patentability issued on Patentability in Application No. PCT/JP2020/015462.
Jun. 23, 2020 International Search Report issued in International Patent Application No. PCT/JP2020/015462.

* cited by examiner

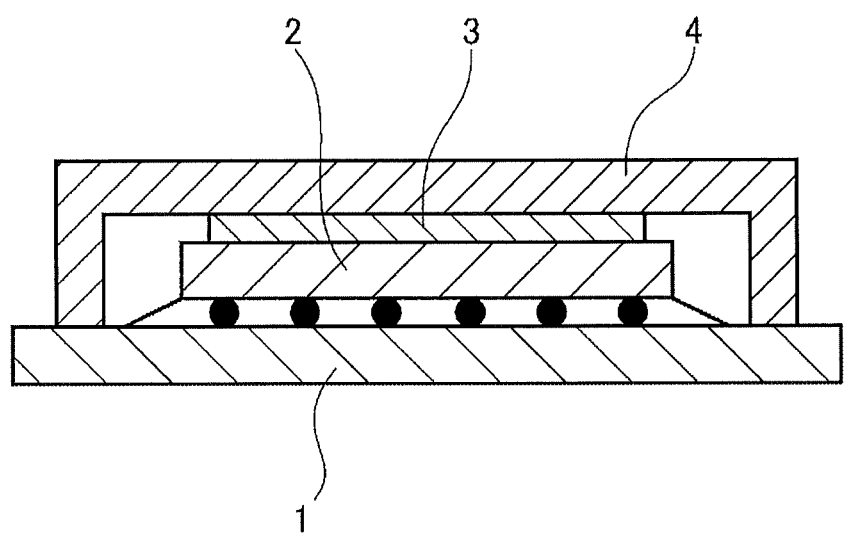

THERMAL CONDUCTIVE SILICONE COMPOSITION, SEMICONDUCTOR DEVICE, AND METHOD FOR MANUFACTURING THE SAME

TECHNICAL FIELD

The present invention relates to: a thermal conductive silicone composition; a semiconductor device; and a method for manufacturing the same.

BACKGROUND ART

Many electronic components generate heat during use, and therefore, it is necessary to take away the heat from the electronic component in order to allow the electronic component to function appropriately. In particular, integrated circuit devices such as CPUs used in personal computers have increased heat output due to higher clock frequency, and measures against heat have become a critical issue.

Accordingly, many methods for dissipating this heat are being proposed. For electronic components with a particularly large heat output, methods of interposing a thermal conductive material such as a thermal conductive grease or a thermal conductive sheet between the electronic component and a member such as a heat sink to release the heat are proposed.

Patent Document 1 discloses a silicone grease composition having a spherical hexagonal aluminum nitride powder with a particle size within a given range blended in a particular organopolysiloxane. Patent Document 2 discloses a thermal conductive organosiloxane composition having a combination of an aluminum nitride powder with a fine particle size and an aluminum nitride powder with a coarse particle size. Patent Document 3 discloses a thermal conductive silicone grease having a combination of an aluminum nitride powder and a zinc oxide powder. Patent Document 4 discloses a thermal conductive grease composition employing an aluminum nitride powder surface-treated with organosilane.

The thermal conductivity of aluminum nitride is 70 to 270 W/mK. As a material with a higher thermal conductivity, there can be listed diamond whose thermal conductivity is 900 to 2,000 W/mK. Patent Document 5 discloses a thermal conductive silicone composition employing diamond, zinc oxide, and a dispersant in a silicone resin.

Patent Document 6 and Patent Document 7 disclose a thermal conductive grease composition prepared by mixing a metallic aluminum powder into a base oil such as a silicone oil.

Furthermore, Patent Documents 8 to 12 etc. also disclose using a silver powder with a high thermal conductivity as a filler.

Although some of the above materials exhibit a high thermal conductivity, the materials have a large minimum thickness (BLT) when compressed, and have a high thermal resistance. Meanwhile, those exhibiting a low thermal resistance have high hardness after heating and curing, and if applied to an electronic component, are liable to peel and lack reliability. Thus, none of the above thermal conductive materials and thermal conductive greases are satisfactory for heat output of integrated circuit devices such as a CPU in recent days.

CITATION LIST

Patent Literature

Patent Document 1: JP H2-153995 A
Patent Document 2: JP H3-14873 A
Patent Document 3: JP H10-110179 A
Patent Document 4: JP 2000-63872 A
Patent Document 5: JP 2002-30217 A
Patent Document 6: JP 2000-63873 A
Patent Document 7: JP 2008-222776 A
Patent Document 8: JP 3130193 B
Patent Document 9: JP 3677671 B
Patent Document 10: JP 2017-066406 A
Patent Document 11: WO 2017/159252
Patent Document 12: JP 2018-058953 A

SUMMARY OF INVENTION

Technical Problem

The present invention has been made to solve the above-described problem, and an object of the present invention is to provide: a thermal conductive silicone composition that gives a cured material having a favorable heat-dissipating property; a semiconductor device using the cured material of the composition; and a method for manufacturing the same.

Solution to Problem

To achieve the object, the present invention provides a thermal conductive silicone composition comprising the following components (A), (B), (C), (D), and (E):
  (A) 100 parts by mass of an organopolysiloxane containing at least two alkenyl groups bonded to a silicon atom in one molecule;
  (B) an organohydrogenpolysiloxane containing at least two hydrogen atoms bonded to a silicon atom in one molecule in an amount to provide 0.2 to 10 mol of the silicon-bonded hydrogen atoms within the component (B) for every 1 mol of the alkenyl groups in all the composition;
  (C) 0.1 to 2,000 ppm of a catalyst for hydrosilylation reaction relative to a total amount of the components (A) and (B) on a mass basis in terms of a catalyst metal element;
  (D) 300 to 2,000 parts by mass of a silver powder with a tapped density of 3.0 g/cm$^3$ or higher, a specific surface area of 2.0 m$^2$/g or less, and an aspect ratio of 1 to 30; and
  (E) 0.3 to 100 parts by mass of a natural graphite powder or a synthetic graphite powder with an average particle size of 3 μm to 50 μm.

This thermal conductive silicone composition gives a cured material that has excellent thermal conductivity, that is, low thermal resistance, and is therefore, useful for a semiconductor device that requires a favorable heat-dissipating effect.

In addition, the present invention provides a semiconductor device comprising a heat-generating electronic component and a radiator, wherein a cured material of the above-described thermal conductive silicone composition is interposed between the heat-generating electronic component and the radiator.

This semiconductor device has a high thermal conductivity of heat generated in the heat-generating electronic component to the radiator.

Furthermore, the present invention provides a method for manufacturing a semiconductor device comprising a step of: heating the above-described thermal conductive silicone composition to 80° C. or higher in a state of having a pressure of 0.01 MPa or higher applied between a heat-generating electronic component and a radiator.

A semiconductor device with a high thermal conductivity of heat generated in a heat-generating electronic component to a radiator can be manufactured by this method for manufacturing a semiconductor device.

Advantageous Effects of Invention

The inventive thermal conductive silicone composition gives a cured material that has excellent thermal conductivity, that is, low thermal resistance, and is therefore, useful for a semiconductor device that requires a favorable heat-dissipating effect.

BRIEF DESCRIPTION OF DRAWINGS

FIG. 1 is a schematic view of a vertical cross section showing an example of the inventive semiconductor device.

DESCRIPTION OF EMBODIMENTS

As described above, it has been desired to develop: a thermal conductive silicone composition that gives a cured material having a favorable heat-dissipating property; a semiconductor device employing the cured material of the composition; and a method for manufacturing the same.

The present inventor has earnestly studied to achieve the object, and found out that by mixing a silver powder having a specific tapped density, a specific surface area, and aspect ratio and a graphite powder having a specific average particle size in a specific organopolysiloxane, the thermal conductivity of a cured material of the composition can be dramatically enhanced, and completed the present invention.

That is, the present invention is a thermal conductive silicone composition comprising the following components (A), (B), (C), (D), and (E):
(A) 100 parts by mass of an organopolysiloxane containing at least two alkenyl groups bonded to a silicon atom in one molecule;
(B) an organohydrogenpolysiloxane containing at least two hydrogen atoms bonded to a silicon atom in one molecule in an amount to provide 0.2 to 10 mol of the silicon-bonded hydrogen atoms within the component (B) for every 1 mol of the alkenyl groups in all the composition;
(C) 0.1 to 2,000 ppm of a catalyst for hydrosilylation reaction relative to a total amount of the components (A) and (B) on a mass basis in terms of a catalyst metal element;
(D) 300 to 2,000 parts by mass of a silver powder with a tapped density of 3.0 g/cm$^3$ or higher, a specific surface area of 2.0 m$^2$/g or less, and an aspect ratio of 1 to 30; and
(E) 0.3 to 100 parts by mass of a natural graphite powder or a synthetic graphite powder with an average particle size of 3 μm to 50 μm.

Hereinafter, the present invention will be described in detail, but the present invention is not limited thereto.
<Organopolysiloxane>

The organopolysiloxane of the component (A) is a base polymer of the inventive composition, and contains at least two alkenyl groups bonded to a silicon atom in one molecule.

Examples of the molecular structure of the component (A) include a linear structure and a cyclic structure, and these structures may be branched. However, it is preferable to use, as the component (A), a linear diorganopolysiloxane having a main chain basically composed of repeating diorganosiloxane units, and both molecular chain terminals blocked by triorganosiloxy groups.

When the kinematic viscosity of the component (A) at 25° C. is 10 mm$^2$/s or higher, oil bleeding does not easily occur in the composition, and when 100,000 mm$^2$/s or lower, the kinematic viscosity of the composition does not become high, so that good handleability can be achieved. Therefore, the kinematic viscosity of the component (A) at 25° C. is preferably 10 to 100,000 mm$^2$/s, more preferably 100 to 50,000 mm$^2$/s. Note that the kinematic viscosity of the organopolysiloxane of the component (A) described in the present description is a value measured by an Ostwald viscometer at 25° C.

Examples of the alkenyl groups bonded to a silicon atom in the component (A) include those preferably having 2 to 8 carbon atoms, more preferably 2 to 4 carbon atoms, such as a vinyl group, an allyl group, a butenyl group, a pentenyl group, a hexenyl group, and a heptenyl group. A vinyl group is further preferable. When the organopolysiloxane of the component (A) has a linear structure, the alkenyl groups may be bonded to the silicon atoms at only the molecular chain terminals or at only non-terminal portions, or may be bonded to the silicon atoms at both.

Examples of organic groups bonded to a silicon atom in the component (A) other than an alkenyl group include alkyl groups, in particular, alkyl groups having 1 to 10 carbon atoms such as a methyl group, an ethyl group, a propyl group, a butyl group, a pentyl group, a hexyl group, a cyclohexyl group, and a heptyl group; aryl groups, in particular, aryl groups having 6 to 14 carbon atoms such as a phenyl group, a tolyl group, a xylyl group, and a naphthyl group; aralkyl groups, in particular, aralkyl groups having 7 to 14 carbon atoms such as a benzyl group and a phenethyl group; unsubstituted or halogen-substituted monovalent hydrocarbon groups such as halogenated alkyl groups, in particular, halogenated alkyl groups having 1 to 3 carbon atoms such as a chloromethyl group, a 3-chloropropyl group, and a 3,3,3-trifluoropropyl group. A methyl group and a phenyl group are particularly preferable.

Specific examples of the component (A) include dimethylsiloxane-methylvinylsiloxane copolymers capped at both ends of the molecular chain with trimethylsiloxy groups, methylvinylpolysiloxane capped at both ends of the molecular chain with trimethylsiloxy groups, dimethylsiloxane-methylvinylsiloxane-methylphenylsiloxane copolymers capped at both ends of the molecular chain with trimethylsiloxy groups, dimethylpolysiloxane capped at both ends of the molecular chain with dimethylvinylsiloxy groups, methylvinylpolysiloxane capped at both ends of the molecular chain with dimethylvinylsiloxy groups, dimethylsiloxane-methylvinylsiloxane copolymers capped at both ends of the molecular chain with dimethylvinylsiloxy groups, dimethylsiloxane-methylvinylsiloxane-methylphenylsiloxane copolymers capped at both ends of the molecular chain with dimethylvinylsiloxy groups, dimethylpolysiloxane capped at both ends of the molecular chain with trivinylsiloxy groups, organopolysiloxane copolymers including a siloxane unit shown by the formula $R^1_3SiO_{0.5}$ ($R^1$ represents an unsubstituted or substituted monovalent hydrocarbon group other than an alkenyl group, and the same applies hereinafter), a siloxane unit shown by the formula $R^1_2R^2SiO_{0.5}$ ($R^2$ represents an alkenyl group, and the same applies hereinafter), a unit shown by the formula $R^1_2SiO$, and a siloxane unit shown by the formula $SiO_2$, organopolysiloxane copolymers including a siloxane unit shown by the formula $R^1_3SiO_{0.5}$, a siloxane unit shown by the formula $R^1{}_2R^2SiO_{0.5}$, and a siloxane unit shown by the formula $SiO_2$, organopolysiloxane copolymers including a siloxane unit shown by the formula $R^1{}_2R^2SiO_{0.5}$, a siloxane unit shown by the formula $R^1{}_2SiO$, and a siloxane unit shown by the formula $SiO_2$, and organopolysiloxane copolymers including a siloxane unit shown by the formula $R^1R^2SiO$ and a siloxane unit shown by the formula $R^1SiO_{1.5}$ or a siloxane unit shown by the formula $R^2SiO_{1.5}$. One of these components (A) may be used, or a combination of two or more thereof may be used.

Examples of $R^1$ in the above formulae include alkyl groups such as a methyl group, an ethyl group, a propyl group, a butyl group, a pentyl group, a hexyl group, and a heptyl group; aryl groups such as a phenyl group, a tolyl group, a xylyl group, and a naphthyl group; aralkyl groups such as a benzyl group and a phenethyl group; and halogenated alkyl groups such as a chloromethyl group, a 3-chloropropyl group, and a 3,3,3-trifluoropropyl group. Meanwhile, examples of $R^2$ in the above formulae include a vinyl group, an allyl group, a butenyl group, a pentenyl group, a hexenyl group, and a heptenyl group.

The inventive composition preferably contains 4 to 25 mass % of the component (A).

<Organohydrogenpolysiloxane>

The organohydrogenpolysiloxane of the component (B) acts as a crosslinking agent by reacting with the component (A). The molecular structure of the component (B) is not particularly limited, and it is possible to employ various conventionally known organohydrogenpolysiloxanes of, for example, linear, cyclic, branched, three-dimensional network (resinous) structures, and the like.

The organohydrogenpolysiloxane of the component (B) contains two or more, preferably three or more (normally, about 3 to 500, preferably 3 to 200, more preferably 3 to 100) hydrogen atoms bonded to silicon atoms (that is, hydrosilyl groups or SiH groups) per molecule. When the organohydrogenpolysiloxane of the component (B) has a linear structure, these SiH groups may be positioned only in the molecular chain terminals or only in non-terminal portions, or may be positioned in both.

The number (degree of polymerization) of the silicon atoms in one molecule of the component (B) is preferably about 2 to 1,000, more preferably 3 to 300, and further preferably 4 to 150. Furthermore, the viscosity of the component (B) at 25° C. is preferably about 0.1 to 5,000 mPa·s, more preferably 0.5 to 1,000 mPa·s, further preferably 5 to 500 mPa·s. Note that the viscosity (absolute viscosity) of the component (B) organohydrogenpolysiloxane described in the present description is a value at 25° C. measured by, for example, PC-1TL (10 rpm) manufactured by Malcom Co., Ltd.

As the component (B), it is possible to use, for example, an organohydrogenpolysiloxane shown by the following average composition formula (1):

$$R^3{}_aH_bSiO_{(4-a-b)/2} \quad (1)$$

In the formula, $R^3$ represents an unsubstituted or substituted monovalent hydrocarbon group other than an aliphatic unsaturated group, preferably having 1 to 14 carbon atoms, more preferably 1 to 10 carbon atoms and bonded to a silicon atom; and "a" and "b" are positive numbers that preferably satisfy $0.7 \le a \le 2.1$, $0.001 \le b \le 1.0$, and $0.8 \le a+b \le 3.0$, more preferably $0.9 \le a \le 2.0$, $0.01 \le b \le 1.0$, and $1.0 \le a+b \le 2.5$.

Examples of $R^3$ include alkyl groups such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, and a decyl group; aryl groups such as a phenyl group, a tolyl group, a xylyl group, and a naphthyl group; aralkyl groups such as a benzyl group, a phenylethyl group, and a phenylpropyl group; groups in which some or all of the hydrogen atoms in these hydrocarbon groups are substituted with halogen atoms such as fluorine, bromine, or chlorine, for example, a chloromethyl group, a 3-chloropropyl group, a bromoethyl group, or a 3,3,3-trifluoropropyl group. Alkyl groups and aryl groups are preferable, and a methyl group and a phenyl group are more preferable.

The component (B) can be obtained by a known production method. Common production methods include, for example, a method of equilibrating a 1,3,5,7-tetramethyl-1,3,5,7-tetrahydrocyclotetrasiloxane (in some cases, a mixture of the cyclotetrasiloxane and an octamethylcyclotetrasiloxane) and a siloxane compound to be a source of a terminal group such as a hexamethyldisiloxane or a 1,3-dihydro-1,1,3,3-tetramethyldisiloxane, or an octamethylcyclotetrasiloxane and a 1,3-dihydro-1,1,3,3-tetramethyldisiloxane in the presence of a catalyst such as a sulfuric acid, a trifluoromethanesulfonic acid, or a methanesulfonic acid at a temperature of about −10 to +40° C.

Specific examples of the component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, methylhydrogenpolysiloxane capped at both ends of the molecular chain with trimethylsiloxy groups, dimethylsiloxane-methylhydrogensiloxane copolymers capped at both ends of the molecular chain with trimethylsiloxy groups, dimethylsiloxane-methylhydrogensiloxane-methylphenylsiloxane copolymers capped at both ends of the molecular chain with trimethylsiloxy groups, dimethylpolysiloxane capped at both ends of the molecular chain with dimethylhydrogensiloxy groups, dimethylpolysiloxane-methylhydrogensiloxane copolymers capped at both ends of the molecular chain with dimethylhydrogensiloxy groups, dimethylsiloxane-methylphenylsiloxane copolymers capped at both ends of the molecular chain with dimethylhydrogensiloxy groups, methylphenylpolysiloxane capped at both ends of the molecular chain with dimethylhydrogensiloxy groups, organopolysiloxane copolymers including a siloxane unit shown by the formula $R^1{}_3SiO_{0.5}$ ($R^1$ is as defined and exemplified in the component (A), and the same applies hereinafter), a siloxane unit shown by the formula $R^1{}_2HSiO_{0.5}$, and a siloxane unit shown by the formula $SiO_2$, organopolysiloxane copolymers including a siloxane unit shown by the formula $R^1{}_2HSiO_{0.5}$ and a siloxane unit shown by the formula $SiO_2$, and organopolysiloxane copolymers including a siloxane unit shown by the formula $R^1HSiO$ and a siloxane unit shown by the formula $R^1SiO_{1.5}$ or a siloxane unit shown by the formula $HSiO_{1.5}$. One of these components (B) may be used, or a combination of two or more thereof may be used.

The amount of the component (B) to be blended is an amount to provide 0.2 to 10 mol, preferably 1.0 to 8.0 mol of the silicon-bonded hydrogen atoms (SiH groups) within the component (B) for every 1 mol of the alkenyl groups in all the composition. In this event, the proportion of the alkenyl groups bonded to silicon atoms in the component (A) to the alkenyl groups present in all the composition is preferably 50 to 100 mol %, more preferably 80 to 100 mol %. When the only component in all the composition to have alkenyl groups is the component (A), the amount is an amount to provide 0.2 to 10 mol, preferably 1.0 to 5.0 mol of the SiH groups within the component (B) for every 1 mol of the silicon-bonded alkenyl groups within the component (A). If the blended amount of the component (B) is too small, the composition does not cure sufficiently in some cases. On the other hand, if the amount is too large, the heat resistance of the obtained cured material (silicone rubber) becomes extremely poor in some cases.

[Catalyst for Hydrosilylation Reaction]

As the catalyst for hydrosilylation reaction of the component (C), any catalyst may be used as long as the catalyst promotes addition reaction between the alkenyl groups in the component (A) and the SiH groups in the component (B). For example, the following are used as the component (C): platinum-based catalysts such as a chloroplatinic acid, an alcohol-modified chloroplatinic acid, a coordination compound of a chloroplatinic acid and an olefin, a vinylsiloxane, or an acetylene compound; palladium-based catalysts such as tetrakis(triphenylphosphine)palladium; and rhodium-based catalysts such as chlorotris(triphenylphosphine) rhodium. Platinum-based catalysts such as a platinum-divinyltetramethyldisiloxane complex are preferable.

The amount of the component (C) to be blended is 0.1 to 2,000 ppm, preferably 1 to 1,500 ppm relative to the total amount of the components (A) and (B) on a mass basis in terms of the catalyst metal element. If the blended amount is too small, addition reaction cannot be sufficiently promoted so that curing becomes insufficient, and if the blended amount is too large, it is economically disadvantageous. Meanwhile, the type of the metal catalyst is not particularly limited as long as the metal has effective activity as a catalyst for hydrosilylation reaction, but platinum etc. that have an activity for dividing hydrogen gas into atoms are useful.

[Silver Powder]

The component (D) is a silver powder with a tapped density of 3.0 g/cm$^3$ or higher, a specific surface area of 2.0 m$^2$/g or less, and an aspect ratio of 1 to 30.

If the tapped density of the component (D) silver powder is lower than 3.0 g/cm$^3$, the filling rate of the component (D) in the composition cannot be raised, so that the composition becomes viscous and workability is degraded. Therefore, the tapped density is preferably 3.0 g/cm$^3$ to 8.0 g/cm$^3$, more preferably 4.5 g/cm$^3$ to 8.0 g/cm$^3$, and further preferably 5.5 g/cm$^3$ to 8.0 g/cm$^3$.

If the specific surface area of the component (D) silver powder is greater than 2.0 m$^2$/g, the filling rate of the component (D) in the composition cannot be raised, so that the composition becomes viscous and workability is degraded. Therefore, the specific surface area is preferably 0.08 m$^2$/g to 2.0 m$^2$/g, more preferably 0.08 m$^2$/g to 1.5 m$^2$/g, and further preferably 0.08 m$^2$/g to 1.0 m$^2$/g.

Note that the tapped density described in the present description is a value calculated as follows. 100 g of the silver powder is weighed out, and the silver powder is gently dropped into a 100-ml measuring cylinder with a funnel. Then, the cylinder is placed on a tapped density measuring device and dropped 600 times at a dropping distance of 20 mm and a rate of 60 times/min. The tapped density is thus calculated from the volume of the compressed silver powder.

Meanwhile, the specific surface area was calculated as follows. About 2 g of the silver powder is taken as a sample, and then degassed at 60±5° C. for 10 minutes. Then, the total surface area thereof is measured with an automatic specific-surface-area measuring device (DET method). Subsequently, the amount of the sample is measured, and the specific surface area is then calculated using the following formula (2).

$$\text{Specific surface area (m}^2\text{/g)}=\text{Total surface area (m}^2\text{)/Sample amount (g)} \qquad (2)$$

The aspect ratio of the component (D) silver powder is 1 to 30, preferably 2 to 20, more preferably 3 to 15. The aspect ratio refers to a ratio between a major axis and a minor axis of a particle (major axis/minor axis). As a method for measuring the aspect ratio, for example, it is possible to take an electron micrograph of particles, and then calculate the aspect ratio based on these major and minor axes of the particles that have been measured by using this micrograph. The size of the particles can be measured based on an electron micrograph taken from above, and a larger diameter in such an electron micrograph taken from above is measured as a major axis. With respect to such a major axis, a minor axis thus corresponds to the thickness of a particle. The thickness of a particle cannot be measured based on an electron micrograph taken from above. The thickness of a particle may be measured as follows. When taking an electron micrograph, a sample stage on which the particles have been mounted is tilted, and the electron micrograph is taken from above. Correction is then performed based on the tilt angle of the sample stage so as to calculate the particle thickness. Specifically, after taking a few electron micrographs at a magnification ratio of several thousand times, the major and minor axes of any 100 particles were measured, followed by calculating the ratios between these major and minor axes (major axis/minor axis), and then obtaining an average value thereof.

The particle size of the silver powder of the component (D) is not particularly limited. However, the average particle size is preferably 0.2 to 30 μm, more preferably 1.0 to 20 μm. The average particle size refers to a volume average diameter [MV] on volumetric basis that is measured by a laser-diffraction-type particle size analyzer as follows. Before measurement, one to two scoops of the silver powder is taken with a microspatula and put in a 100-ml beaker, about 60 ml of isopropyl alcohol is placed therein, and then the silver powder is dispersed with an ultrasonic homogenizer for 1 minute. Here, a measurement time was 30 seconds.

Methods for producing the silver powder employed in the present invention are not particularly limited, but examples include an electrolytic method, a crushing method, a heat treatment method, an atomizing method, and a reduction method.

The silver powder produced by the above method may be used as it is, or may be crushed within the above numerical value ranges before use. When the silver powder is to be crushed, the device for crushing is not particularly restricted. For example, it is possible to use a known device such as a stamp mill, a ball mill, a vibrating mill, a hammer mill, a rolling roller, and a mortar. In particular, a stamp mill, a ball mill, a vibrating mill, and a hammer mill are preferable.

The component (D) is blended in an amount of 300 to 2,000 parts by mass relative to 100 parts by mass of the component (A). If the blended amount of the component (D) relative to 100 parts by mass of the component (A) is less than 300 parts by mass, the thermal resistance of a cured material of the obtained composition heated under pressure becomes great. If the amount is more than 2,000 parts by mass, the cured material heated under pressure becomes hard, and reliability becomes poor. The blended amount of the component (D) is preferably 500 to 1,500 parts by mass, more preferably 600 to 1,200 parts by mass relative to 100 parts by mass of the component (A).

[Graphite Powder]

The component (E) is a natural graphite powder or a synthetic graphite powder with an average particle size of 3 µm to 50 µm.

The inventive thermal conductive silicone composition contains a graphite powder with a specific particle size range, so that the thermal resistance and hardness after heating and curing under pressure are low. Thus, heat-dissipating property and reliability are excellent. This is because the graphite powder does not inhibit the formation of a heat conduction path, and the excessive sintering of silver powder is suppressed.

The average particle size of the component (E) graphite powder is 3 µm to 50 µm, preferably 8 µm to 40 µm, further preferably 10 µm to 30 µm. If the average particle size is less than 3 µm, the composition becomes viscous, and handleability is degraded. Meanwhile, if the average particle size is greater than 50 µm, the formation of the heat conduction path of the silver powder is inhibited, degrading the thermal performance of the cured material of the composition. Note that the average particle size of the graphite powder in the component (E) is a volume average diameter [MV] on volumetric basis that can be measured by Microtrac MT3300EX manufactured by Nikkiso Co., Ltd., for example.

The natural graphite powder of the component (E) is a collection of particles made of natural graphite. The main component of natural graphite is carbon. The shape of natural graphite varies depending on the place of production and so forth, and examples include flake form, mass form, and earth form. For example, flake-form natural graphite is mainly produced from mines of China, America, India, Brazil, etc., and is a graphite with a large aspect ratio. Mass-form natural graphite is produced from mines of Sri Lanka, and is a graphite with a small aspect ratio.

The synthetic graphite powder of the component (E) is a collection of particles made from synthetic graphite. Synthetic graphite is a graphite that can be obtained by treating cokes or the like at a high temperature of about 3000° C. Examples of the shape of the synthetic graphite include plate form, mass form, etc.

The blended amount of the component (E) is 0.3 to 100 parts by mass, preferably 1 to 20 parts by mass, further preferably 2 to 10 parts by mass relative to 100 parts by mass of the component (A). If the blended amount is too small, favorable thermal performance and reliability cannot be imparted to the cured material of the composition in some cases. On the other hand, if the blended amount is too large, the formation of the heat conduction path of the silver powder is inhibited, and the thermal performance of the cured material of the composition is degraded in some cases.

<Other Components>

The inventive thermal conductive silicone composition may contain the following components as optional components in addition to the above components (A) to (E).

[Curing Reaction Controller]

In the inventive composition, it is possible to use all conventionally known curing reaction controllers said to have an effect of suppressing curing against addition reaction catalysts as optional components in addition to the components (A) to (E). Examples of such compounds include phosphorous-containing compounds such as triphenylphosphine; nitrogen-containing compounds such as tributylamine, tetramethylethylene diamine, and benzotriazole; sulfur-containing compounds; acetylene compounds such as 1-ethynyl-1-cyclohexanol; triallyl isocyanuric acid; hydroperoxy compounds; maleic acid derivatives; and the like. The degree of curing retarding effect by the curing reaction controller greatly varies depending on the chemical structure of the curing reaction controller. Accordingly, the amount of the curing reaction controller to be blended should be adjusted to the optimum amount for each individual curing reaction controller to be used, and such an adjustment can be carried out easily by methods well known to a person skilled in the art. Generally, if the blended amount is too small, long-term storage stability of the inventive composition at room temperature cannot be achieved. On the other hand, if the blended amount is too large, curing of the composition is inhibited.

[Inorganic Compound Powder and Organic Compound]

Examples of inorganic compound powder and organic compound material that can be blended other than the component (D) and the component (E) include powder of metals such as aluminum, gold, copper, nickel, indium, gallium, and metallic silicon;

diamond powder;

carbon materials such as carbon fiber;

powder of metallic oxides such as zinc oxide, titanium oxide, magnesium oxide, alumina, iron oxide, and silicon dioxide (such as fumed silica, crystalline silica, and precipitated silica);

powder of metal hydroxides such as aluminum hydroxide;

powder of nitrides such as boron nitride and aluminum nitride;

carbonates such as magnesium carbonate, calcium carbonate, and zinc carbonate;

hollow fillers; silsesquioxane; lamellar mica; diatomaceous earth; glass fiber; silicone rubber powders; silicone resin powders; and the like.

In particular, those having high thermal conductivity are preferable. Examples of inorganic compound powder and organic compound material having high thermal conductivity include an aluminum powder, a zinc oxide powder, a titanium oxide powder, a magnesium oxide powder, an alumina powder, an ammonium hydroxide powder, a boron nitride powder, an aluminum nitride powder, a diamond powder, a gold powder, a copper powder, a nickel powder, an indium powder, a gallium powder, a metallic silicon powder, a silicon dioxide powder, and carbon fiber. One of these may be used, or two or more thereof may be used in combination.

These inorganic compound powders and organic compound materials may be surface-hydrophobized with organosilane, organosilazane, organopolysiloxane, an organic fluorine compound, or the like as necessary. When the average particle size of the inorganic compound powder and the organic compound material is 0.5 µm or more and 100 µm or less, the filling rate in the obtained composition rises. Therefore, the average particle size is preferably 0.5 to 100 µm, more preferably 1 to 50 µm. In addition, when the fiber length of the carbon fiber is 10 µm or more and 500 µm or less, the filling rate in the obtained composition rises. Therefore, the fiber length is preferably 10 to 500 µm, more preferably 30 to 300 µm.

When the total amount of the inorganic compound powder and the organic compound material to be blended is 3,000 parts by mass or less relative to 100 parts by mass of the component (A), flowability of the composition becomes high and handleability of the composition becomes favorable. Therefore, the total amount is preferably 1 to 3,000 parts by mass, more preferably 5 to 2,000 parts by mass.

[Other Optional Components]

Furthermore, the inventive composition may contain, as other optional components, an organopolysiloxane containing one hydrogen atom or alkenyl group bonded to a silicon atom in one molecule, an organopolysiloxane that contains neither hydrogen atoms nor alkenyl groups bonded to a silicon atom, an organic solvent, a heat-resistance imparting agent, a flame retardant, a plasticizer, a thixotropic agent, a dye, an anti-mold agent, and the like, for example.

<Method for Manufacturing Silicone Composition>

As a method for producing the inventive silicone composition, a conventionally known method for producing a silicone composition may be employed, and the method is not particularly restricted. For example, the composition can be produced by mixing the components (A) to (E) and other components if necessary for 10 minutes to 4 hours by using a mixer such as Trimix, Twinmix and Planetary Mixer (all registered trademarks of mixers by INOUE MFG., INC.); Ultramixer (registered trademark of mixer by MIZUHO INDUSTRIAL CO., LTD); and HIVIS DISPER MIX (registered trademark of mixer by PRIMIX Corporation). In addition, if required, mixing may be performed while heating the components at a temperature of 50 to 200° C.

<Viscosity of Silicone Composition>

The inventive thermal conductive silicone composition preferably has an absolute viscosity measured at 25° C. of 10 to 600 Pa·s, more preferably 15 to 500 Pa·s, further preferably 15 to 400 Pa·s. When the absolute viscosity is within the above ranges, a favorable grease can be provided, and excellent workability of the composition can also be achieved. The absolute viscosity can be achieved by adjusting the amount of each component added. The absolute viscosity is a result of measurement using, for example, PC-1TL (10 rpm) manufactured by Malcom Co., Ltd.

<Curing of Silicone Composition>

The inventive thermal conductive silicone composition is cured by heating the thermal conductive silicone composition obtained in the above-described manner to 80° C. or higher in a state of having a pressure of 0.01 MPa or higher applied. The properties of the cured material thus obtained are not limited, and examples include a gel form, a low-hardness rubber form, or a high-hardness rubber form.

<Semiconductor Device>

The inventive semiconductor device has a cured material of the inventive thermal conductive silicone composition interposed between a surface of a heat-generating electronic component and a radiator. It is preferable to have the cured material of the inventive thermal conductive silicone composition interposed with a thickness of 10 to 500 μm.

A typical structure is shown in FIG. 1, but the present invention is not limited thereto. A cured material 3 of the inventive thermal conductive silicone composition is interposed between a heat-generating electronic component 2 such as a CPU mounted on a substrate 1 and a radiator 4 such as a lid. Heat generated from the heat-generating electronic component 2 is conducted to the radiator 4 through the cured material 3, and dissipated outside.

<Method for Manufacturing Semiconductor Device>

The inventive method for manufacturing a semiconductor device includes a step of heating the inventive thermal conductive silicone composition to 80° C. or higher in a state of having a pressure of 0.01 MPa or higher applied between a heat-generating electronic component and a radiator. In this event, the applied pressure is preferably 0.05 MPa to 100 MPa, more preferably 0.1 MPa to 100 MPa. The heating temperature is preferably 100° C. to 300° C., more preferably 120° C. to 300° C., further preferably 140° C. to 300° C.

EXAMPLE

Hereinafter, the present invention will be described further specifically by using Examples and Comparative Examples for the purpose of clarifying the advantageous effects of the present invention further. However, the present invention is not limited thereto.

Viscosity, thermal resistance, and Asker C hardness were measured as follows.

(Viscosity)

The absolute viscosity of the composition was measured by using a Malcolm viscometer (type PC-1TL) at 25° C.

(Thermal Resistance)

Each composition was sandwiched between two aluminum plates of #12.7 mm, and then left in an oven of 150° C. for 90 minutes in a state of having a pressure of 0.35 Mpa applied to heat and cure each composition. Thus, test specimens for thermal resistance measurement were made, and the thermal resistance was measured. Note that this thermal resistance measurement was carried out using NanoFlash (LFA447 manufactured by NETZSCH).

(Asker C Hardness)

Each composition of the Examples 1 to 14 and Comparative Examples 1 to 6 shown in the following Tables 1 to 3 was poured into a mold with a thickness of 12 mm and heated to 150° C. under a pressure of 0.35 MPa. Subsequently, an automatic hardness tester digi test II manufactured by BAREISS was used to measure the Asker C hardness at 25° C. in each case.

The components for producing the compositions were as follows.

Component (A): dimethylpolysiloxane with both terminals blocked by a dimethylvinylsilyl group, and having a kinematic viscosity at 25° C. of 600 mm$^2$/s Component (B): organohydrogenpolysiloxane represented by the following formula (viscosity at 25° C. of 30 mm$^2$/s)

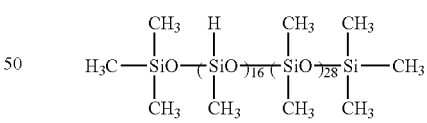

Component (C): solution of a platinum-divinyltetramethyldisiloxane complex in the component (A) (content of 1 mass % in terms of platinum atoms)

Component (D)

(D-1): silver powder having a tapped density of 6.6 g/cm$^3$, a specific surface area of 0.28 m$^2$/g, and an aspect ratio of 8

(D-2): silver powder having a tapped density of 6.0 g/cm$^3$, a specific surface area of 0.91 m$^2$/g, and an aspect ratio of 3

(D-3): silver powder having a tapped density of 3.0 g/cm$^3$, a specific surface area of 2.0 m$^2$/g, and an aspect ratio of 30

Component (E)

(E-1): flake-form natural graphite having an average particle size of 18 μm
(E-2): flake-form natural graphite having an average particle size of 4 μm
(E-3): flake-form natural graphite having an average particle size of 48 μm
(E-4): mass-form natural graphite having an average particle size of 10 μm
(E-5): plate-form synthetic graphite having an average particle size of 10 μm
(E-6) (Comparative Example): flake-form natural graphite having an average particle size of 2 μm
(E-7) (Comparative Example): flake-form natural graphite having an average particle size of 55 μm Component (F): 1-ethynyl-1-cyclohexanol as a Curing Reaction Inhibitor

[Examples 1 to 14] and [Comparative Examples 1 to 6]

The components were mixed according to the compositions shown in the following Tables 1 to 3 in the following manner to obtain the compositions of Examples 1 to 14 and Comparative Examples 1 to 6.

That is, the components (A) and (D) were placed in a 5-liter planetary mixer (manufactured by INOUE MFG., INC.), the components (C), (E), and (F) were added, and were mixed at 25° C. for 1.5 hours. Next, the component (B) was added and mixed so as to homogenize the mixture. The above-described tests were performed on the obtained compositions. Tables 1 to 3 show the results.

TABLE 1

|  | Example 1 | Example 2 | Example 3 | Example 4 | Example 5 | Example 6 | Example 7 |
| --- | --- | --- | --- | --- | --- | --- | --- |
| (A) | 100 | 100 | 100 | 100 | 100 | 100 | 100 |
| (B) | 5 | 5 | 5 | 5 | 5 | 5 | 5 |
| (C) | 6.7 | 6.7 | 6.7 | 6.7 | 6.7 | 6.7 | 6.7 |
| (D-1) | 900 | — | — | — | — | — | — |
| (D-2) | — | 1200 | 600 | 900 | — | 1900 | 350 |
| (D-3) | — | — | — | — | 900 | — | — |
| (E-1) | 4.5 | 4.5 | 4.5 | 4.5 | 4.5 | 4.5 | 4.5 |
| (E-2) | — | — | — | — | — | — | — |
| (E-3) | — | — | — | — | — | — | — |
| (E-4) | — | — | — | — | — | — | — |
| (E-5) | — | — | — | — | — | — | — |
| (E-6) | — | — | — | — | — | — | — |
| (E-7) | — | — | — | — | — | — | — |
| (F) | 0.17 | 0.17 | 0.17 | 0.17 | 0.17 | 0.17 | 0.17 |
| Viscosity (Pa · s) | 100 | 150 | 50 | 70 | 150 | 400 | 12 |
| Thermal resistance (mm$^2$ · K/W) | 0.7 | 0.8 | 2.0 | 1.0 | 3.0 | 0.5 | 3.3 |
| Asker C hardness | 65 | 50 | 30 | 40 | 38 | 90 | 20 |

The unit for the blended amount of the components (A) to (F) is parts by mass.

TABLE 2

|  | Example 8 | Example 9 | Example 10 | Example 11 | Example 12 | Example 13 | Example 14 |
| --- | --- | --- | --- | --- | --- | --- | --- |
| (A) | 100 | 100 | 100 | 100 | 100 | 100 | 100 |
| (B) | 5 | 5 | 5 | 5 | 5 | 5 | 5 |
| (C) | 6.7 | 6.7 | 6.7 | 6.7 | 6.7 | 6.7 | 6.7 |
| (D-1) | — | — | — | — | — | — | — |
| (D-2) | 900 | 900 | 900 | 900 | 900 | 900 | 900 |
| (D-3) | — | — | — | — | — | — | — |
| (E-1) | — | — | — | — | 0.4 | 0.4 | 95 |
| (E-2) | 4.5 | — | — | — | — | — | — |
| (E-3) | — | 4.5 | — | — | — | — | — |
| (E-4) | — | — | 4.5 | — | — | — | — |
| (E-5) | — | — | — | 4.5 | — | — | — |
| (E-6) | — | — | — | — | — | — | — |
| (E-7) | — | — | — | — | — | — | — |
| (F) | 0.17 | 0.17 | 0.17 | 0.17 | 0.17 | — | 0.17 |
| Viscosity (Pa · s) | 300 | 200 | 150 | 120 | 50 | 580 | 590 |
| Thermal resistance (mm$^2$ · K/W) | 1.5 | 3.0 | 1.5 | 2.5 | 1.5 | 1.5 | 3.8 |
| Asker C hardness | 40 | 38 | 35 | 40 | 55 | 45 | 42 |

The unit for the blended amount of the components (A) to (F) is parts by mass.

TABLE 3

| | Comparative Example 1 | Comparative Example 2 | Comparative Example 3 | Comparative Example 4 | Comparative Example 5 | Comparative Example 6 |
|---|---|---|---|---|---|---|
| (A) | 100 | 100 | 100 | 100 | 100 | 100 |
| (B) | 5 | 5 | 5 | 5 | 5 | 5 |
| (C) | 6.7 | 6.7 | 6.7 | 6.7 | 6.7 | 6.7 |
| (D-1) | — | — | — | — | — | — |
| (D-2) | 280 | 2200 | 900 | 900 | 900 | 900 |
| (D-3) | — | — | — | — | — | — |
| (E-1) | 4.5 | 4.5 | 0.2 | 110 | — | — |
| (E-2) | — | — | — | — | — | — |
| (E-3) | — | — | — | — | — | — |
| (E-4) | — | — | — | — | — | — |
| (E-5) | — | — | — | — | — | — |
| (E-6) | — | — | — | — | 2 | — |
| (E-7) | — | — | — | — | — | 4.5 |
| (F) | 0.17 | 0.17 | 0.17 | 0.17 | 0.17 | 0.17 |
| Viscosity (Pa · s) | 10 | 650 | 40 | >1000 | >1000 | 400 |
| Thermal resistance (mm² · K/W) | 5.5 | 0.4 | 1.8 | 6.0 | 3.5 | 6.5 |
| Asker C hardness | 10 | >95 | >95 | 38 | 70 | 25 |

The unit for the blended amount of the components (A) to (F) is parts by mass.

The absolute viscosities of the thermal conductive silicone compositions of Examples 1 to 14 were within an appropriate range, and the compositions were excellent in handleability. The cured materials obtained by heating these thermal conductive silicone compositions under pressure had low thermal resistance, and these cured materials had a high heat-dissipating property. In addition, the hardness of these cured materials was not too high, and these cured materials were highly reliable as cured materials to be interposed between a heat-generating electronic component and a radiator.

The thermal resistance of the cured material of the thermal conductive silicone composition of Comparative Example 1, the composition having too low a content of silver powder, was high, and this cured material had a low heat-dissipating property. The hardness of the cured material of the thermal conductive silicone composition of Comparative Example 2, the composition having too high a content of silver powder, was high, and this cured material had poor reliability as a cured material to be interposed between a heat-generating electronic component and a radiator.

The hardness of the cured material of the thermal conductive silicone composition of Comparative Example 3, the composition having too low a content of graphite, was high, and this cured material had poor reliability as a cured material to be interposed between a heat-generating electronic component and a radiator.

The absolute viscosity of the thermal conductive silicone composition of Comparative Example 4 with too high a content of graphite and the absolute viscosity of the thermal conductive silicone composition of Comparative Example 5 having graphite with too small an average particle size were too high, and these compositions had low handleability.

The thermal resistance of the cured material of the thermal conductive silicone composition of Comparative Example 6, the composition having graphite with too large an average particle size, was high, and this cured material had a low heat-dissipating property.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

REFERENCE SIGNS LIST

1 . . . substrate, 2 . . . heat-generating electronic component (CPU),
3 . . . cured material layer of thermal conductive silicone composition, 4 . . . radiator (lid).

The invention claimed is:

1. A thermal conductive silicone composition comprising the following components (A), (B), (C), (D), and (E):
   (A) 100 parts by mass of an organopolysiloxane containing two or more alkenyl groups bonded to a silicon atom in one molecule;
   (B) an organohydrogenpolysiloxane containing two or more hydrogen atoms bonded to a silicon atom in one molecule in an amount to provide 0.2 to 10 mol of the silicon-bonded hydrogen atoms within the component (B) for every 1 mol of the alkenyl groups in all the composition;
   (C) 0.1 to 2,000 ppm of a catalyst for hydrosilylation reaction relative to a total amount of the components (A) and (B) on a mass basis in terms of a catalyst metal element;
   (D) 300 to 2,000 parts by mass of a silver powder with a tapped density of 3.0 g/cm³ or higher, a specific surface area of 2.0 m²/g or less, and an aspect ratio of 1 to 30; and
   (E) 0.3 to 100 parts by mass of a natural graphite powder or a synthetic graphite powder with an average particle size of 3 μm to 50 μm.

2. A semiconductor device comprising a heat-generating electronic component and a radiator, wherein a cured material of the thermal conductive silicone composition according to claim 1 is interposed between the heat-generating electronic component and the radiator.

3. A method for manufacturing a semiconductor device comprising a step of:
   heating the thermal conductive silicone composition according to claim 1 to 80° C. or higher in a state of having a pressure of 0.01 MPa or higher applied between a heat-generating electronic component and a radiator.

* * * * *